United States Patent [19]
Parkhe

[11] Patent Number: 6,033,482
[45] Date of Patent: Mar. 7, 2000

[54] METHOD FOR IGNITING A PLASMA IN A PLASMA PROCESSING CHAMBER

[75] Inventor: Vijay Parkhe, Sunnyvale, Calif.

[73] Assignee: Applied Materials, Inc., Santa Clara, Calif.

[21] Appl. No.: 09/058,435

[22] Filed: Apr. 10, 1998

[51] Int. Cl.[7] .................................................. C23C 16/00
[52] U.S. Cl. ....................... 118/728; 156/345; 361/234; 279/128
[58] Field of Search ................................ 118/500, 728; 156/345; 361/234; 279/128

[56] References Cited

U.S. PATENT DOCUMENTS

| | | | |
|---|---|---|---|
| 5,460,684 | 10/1995 | Saeki et al. | 156/345 |
| 5,463,525 | 10/1995 | Barnes et al. | 361/234 |
| 5,665,166 | 9/1997 | Deguchi et al. | 118/723 E |
| 5,665,167 | 9/1997 | Deguchi et al. | 118/728 |
| 5,815,366 | 9/1998 | Morita et al. | 361/234 |
| 5,880,924 | 3/1999 | Kumar et al. | 361/234 |

FOREIGN PATENT DOCUMENTS

| | | |
|---|---|---|
| 0 439 000 B1 | 9/1994 | European Pat. Off. . |
| 0 660 499 A1 | 6/1995 | European Pat. Off. . |
| 10 027780 | 1/1998 | Japan . |

*Primary Examiner*—Kathryn Gorgos
*Assistant Examiner*—Wesley A. Nicolas
*Attorney, Agent, or Firm*—Thomason, Moser & Patterson

[57] ABSTRACT

A method and apparatus to prevent charging of a substrate, retained by an electrostatic chuck in a plasma chamber, during ignition of a plasma. The method deactivates a voltage to the chuck electrodes (or other conductive element in a substrate support pedestal) and allows the chuck electrodes to float during ignition of the plasma. The method activates the chuck electrodes again following the ignition of the plasma.

13 Claims, 2 Drawing Sheets

METHOD FOR IGNITING A PLASMA IN A PLASMA PROCESSING CHAMBER

BACKGROUND OF THE DISCLOSURE

1. Field of the Invention

This invention generally relates to semiconductor wafer processing systems and, more particularly, to a process for igniting a plasma to process a substrate, such as a semiconductor wafer, in a plasma processing chamber of a semiconductor wafer processing system.

2. Description of the Background Art

Substrates such as semiconductor wafers are often processed by methods involving the use of plasma in the presence of the wafer or substrate. During wafer processing, the wafer rests on a pedestal containing an electrostatic chuck that can be a monopolar, or preferably, a bipolar electrostatic chuck. Electrostatic chucks contain one or more electrodes embedded within a dielectric material such as polyimide. Such a polyimide chuck is described in commonly assigned U.S. patent application No. 08/744,039, filed Nov. 5, 1996 U.S. Pat. No. 5,885,469, and incorporated herein by reference. When a voltage is applied to the electrodes, charges on the wafer and charges on the electrodes electrostatically retain the wafer on the chuck surface. As such, the wafer is held in a stationary position while being processed.

To accomplish wafer processing, such as plasma precleaning, a wafer is supported in a process chamber upon a pedestal. The pedestal generally contains an electrostatic chuck for retaining the wafer while the wafer is processed, e.g., exposed to a plasma to sputter clean the surface of the wafer. The chuck has one or more electrodes embedded within a chuck body. The chuck body is fabricated of a dielectric such as polyimide, aluminum nitride, alumina, and the like. In a well known manner, a voltage, applied to the electrodes, retains the wafer against the support surface of the chuck by electrostatic force.

An anode electrode is disposed above the pedestal and the pedestal generally contains a conductive element (e.g., a pedestal base) that is used as a cathode. During plasma cleaning of a wafer, a gas such as argon, helium, hydrogen, or a combination thereof is supplied to the chamber and energy is applied between the cathode and anode to produce a plasma. The active gas atoms bombard the wafer and sputter clean its surface. Typically, energy from a direct current (DC) voltage ignites and sustains the plasma. However, a radio frequency (RF) voltage may also be used to sustain the plasma and/or bias the wafer.

More specifically, in a wafer cleaning process, a reactive cleaning gas (process gas) such as hydrogen is introduced into the chamber. The plasma is formed when electrons are stripped from a portion of the process gas atoms to form positive ions. Positive ions and electrons both leak out of the plasma; however, the electrons, being lighter, move faster and therefore leave more rapidly. As a result, the plasma is at an electric potential that is positive with respect to the chamber walls, which are usually at ground potential. Electron bombardment of the surface of the wafer makes the plasma positive with respect to the wafer. This self bias of the wafer causes ions to accelerate towards the wafer and bombard its surface. If the wafer is further biased with an electric potential from a power supply that is substantially negative with respect to the plasma, additional positive ions from the plasma are accelerated towards the wafer.

While the plasma exists in the chamber, voltages on the wafer and the chuck are generally defined by the potential of the plasma. For the particular case that the wafer is allowed to "float" relative to the chamber walls and the chuck, some charge accumulates on the wafer primarily due to bombardment of the surface by energetic electrons from the plasma. However, as the wafer charges, an electric field develops which acts to repel electrons from the plasma. Thus, the potential difference between the plasma and the wafer is self limiting. The potential difference between the plasma and the floating wafer is approximated by the formula:

$$\Delta V = \frac{kT_e}{2e} \ln\left(\frac{m_i}{2.3 m_e}\right)$$

where $\Delta V$ is the potential difference between the plasma and the floating wafer, k is Boltzmann's constant, $T_e$ is the electron temperature, $m_i$ is the mass of an ion and $m_e$ is the mass of an electron. Typical values of $\Delta V$ are in the range of 1 to 10 volts. This is generally small enough that field emission from the wafer does not occur during plasma processing. However, during plasma ignition, transient bursts of high voltage can cause, under some circumstances, field emission from the wafer.

A plasma in a preclean chamber is typically ignited by a transient burst of high voltage applied to the cathode electrode. The chamber, anode and chuck electrodes are typically grounded during ignition of the plasma. The transient high voltage can be larger than 1000 volts and typically lasts about 1 second, though it can last longer if there are problems achieving ignition. During this transient burst of high voltage, a similarly high transient voltage develops on the wafer. If the voltage on the wafer is large, a substantial electric field exists at the surface of the wafer. If the chuck electrodes are energized during the ignition of the plasma, the transient voltage on the wafer is even higher due to the high electric potential already existing between the chuck electrodes and the wafer.

This high voltage can lead to substantial charging of the wafer through field emission. A similar effect occurs if other components within a pedestal are energized or grounded during plasma ignition including components such as a bias electrode or resistive heater. Charging of the wafer through field emission is undesirable because it leads to substantial charge imbalance between the wafer and the chuck. The charge imbalance results in a residual charge being accumulated on the chuck surface. After the electrodes are deactivated, the residual charge will retain the wafer with such force that the wafer cannot be removed from the chuck. Charging of the chuck surface can also lead to arcing between wafer and chuck that can damage the wafer and/or the chuck.

Therefore, a need exists for a method of protecting a wafer on an electrostatic chuck against charging during ignition of a plasma or other similar high voltage process.

SUMMARY OF THE INVENTION

To overcome the disadvantages associated with the prior art, the method of the present invention deactivates the chuck electrodes just prior to a high voltage process, such as ignition of a plasma, and leaves the electrodes deactivated during that high voltage process. It is critical that the chuck electrodes be floating, i.e., not grounded, during plasma ignition. Once the high voltage process has ceased, e.g., the plasma has been ignited, the chuck electrodes can be energized to retain the wafer without risk of charge build up upon the wafer. The invention is applicable to other components within the substrate support pedestal. As such, resistive heater elements and RF bias electrodes used for wafer biasing should be electrically "floating" during plasma ignition.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
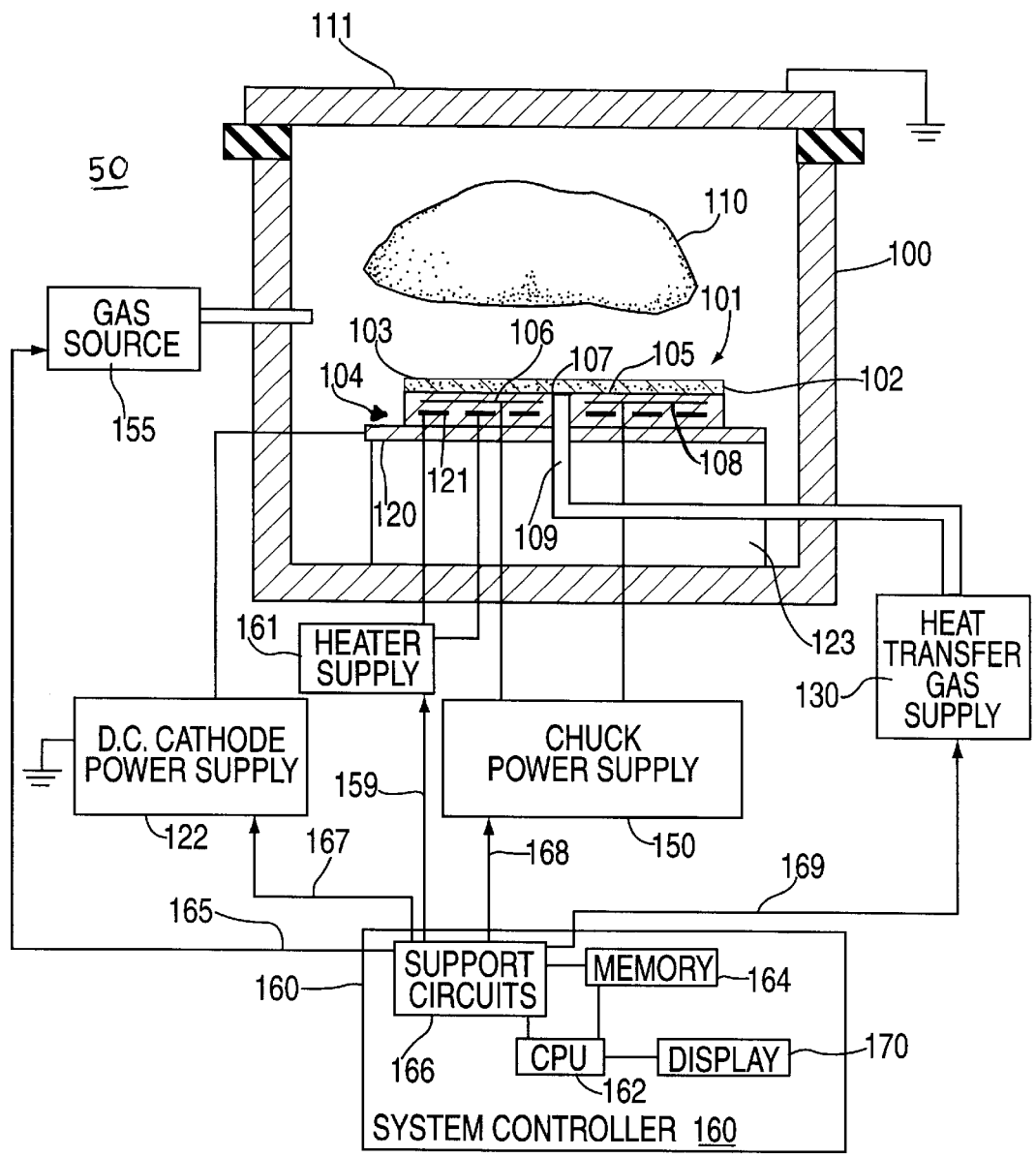
FIG. 1 depicts a block diagram of a typical semiconductor wafer process chamber, illustratively, a "preclean" chamber.
Figure 2:
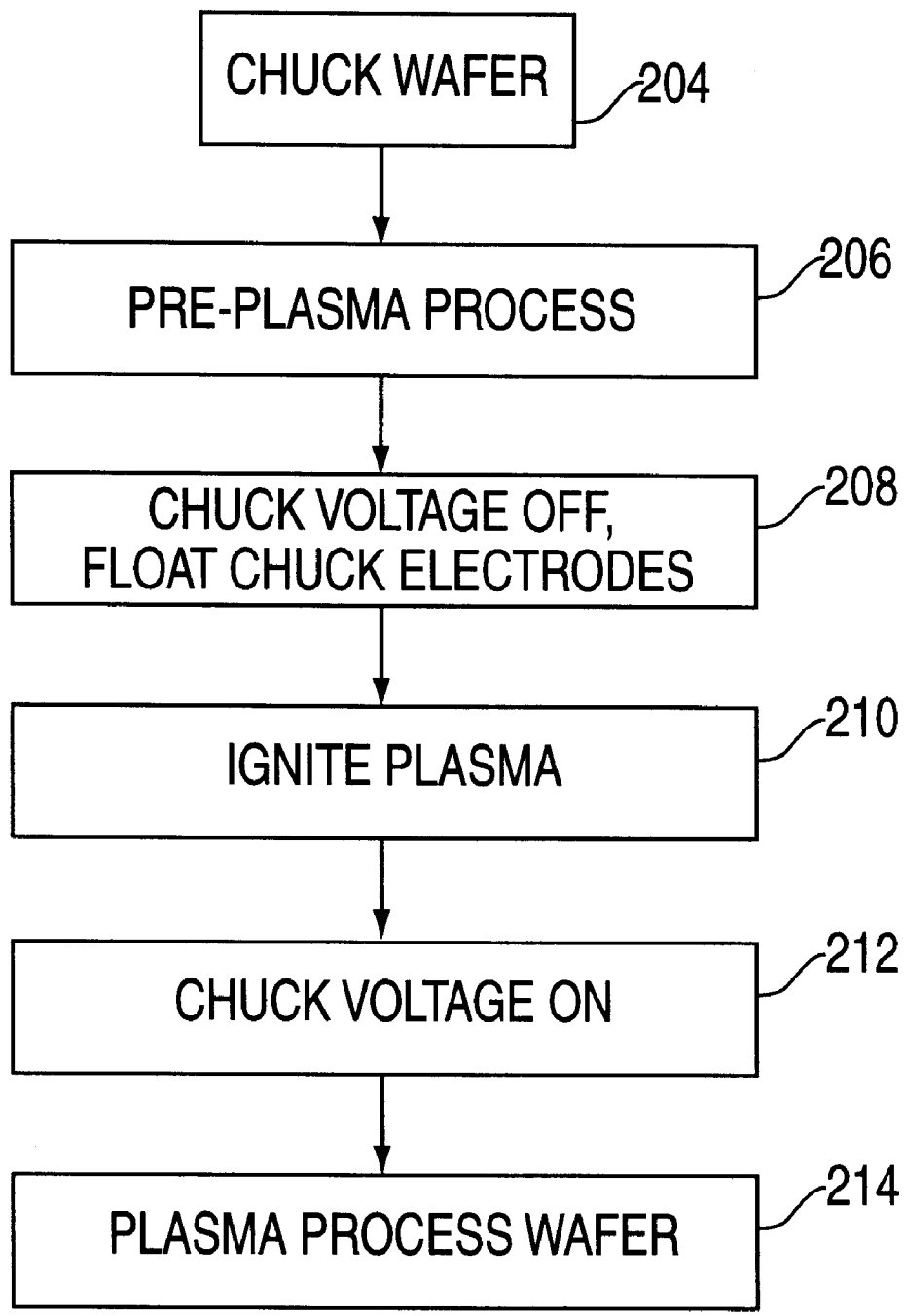
FIG. 2 depicts a flow diagram of the method of the present invention.

The method of the present invention is applied to a semiconductor wafer processing system such as that depicted in FIG. 1 is best understood in terms of the flow diagram of FIG. 2 which shows the steps to be followed to sputter clean a wafer while the wafer is retained in the chamber using a bipolar electrostatic chuck.

FIG. 1 depicts a schematic, cross sectional view of a plasma processing system 50, known as a "preclean" chamber, for "cleaning" a wafer prior to deposition processing. In the preclean chamber 100, a wafer 102 is supported in the chamber 100 upon a pedestal 101 that contains a bipolar electrostatic chuck 104 and a cathode electrode 120. The chuck 104 has a pair of electrodes 106 and 108 embedded within a chuck body 107 made of a dielectric such as polyimide, aluminum nitride, boron nitride, alumina, and the like. A voltage, from a chuck power supply 150, applied to the electrodes 106 and 108, holds the wafer 102 against the chuck 104 by electrostatic force.

For effective cleaning, the wafer must be able to be chucked and temperature controlled prior to a plasma being ignited in the chamber. Temperature control is established by applying a heat transfer medium (a gas such as helium) between the wafer 102 and chuck 104 to fill the vacuum within the interstitial spaces beneath the wafer. Use of a heat transfer medium, generally known as backside gas, promotes uniform heat transfer between the pedestal assembly and the wafer. Chucking is necessary to ensure that a region of backside gas is maintained between the wafer 102 and the chuck 104 such that the wafer does not "float" off the chuck when backside gas is supplied. To allow for the wafer to be temperature stabilized prior to cleaning, bipolar chucks, which do not utilize the plasma to form a ground path to the wafer and thus do not need the plasma to ensure an electrostatic attraction between the wafer and the chuck, are generally used in preclean chambers because the plasma will not be ignited until the wafer is heated. As such, electrostatic chucks having two or more electrodes can be used in a preclean chamber as long as a bipolar chucking voltage is applied to at least two electrodes. Any chucking voltage may be used with the method of the present invention including DC and AC. Alternatively, although less common in preclean chambers, a monopolar chuck (also known as a unipolar chuck) having a single electrode within the chuck body and utilizing a wafer grounding electrode in contact with the wafer may be used to chuck the wafer 102 without the presence of the plasma 110. By applying a voltage between the grounding electrode and the embedded electrode, the wafer 102 is electrostatically retained on a monopolar chuck without a plasma.

A heat transfer gas supply 130 provides gas for transferring heat between the wafer 102 and the chuck 104. The gas flows through a passageway 109 in the chuck body 107 to the support surface 105 and disperses between the wafer and support surface to improve heat transfer between the pedestal and wafer. Alternatively, the wafer 102 can rest on a biased pedestal having one or more bias electrodes (not shown, but similar to the chucking electrodes) for applying a direct current (DC) or radio frequency (RF) bias voltage to the wafer 102. Furthermore, the pedestal may contain a resistive heater 121 and/or biasing electrodes with or without electrodes for the electrostatic chuck.

An anode electrode 111 is disposed above the wafer 102 and the chuck 104. The cathode electrode 120 is disposed immediately below the chuck 104 and supports the chuck 104 in the chamber 100. Alternatively, the cathode electrode may be formed by additionally or alternatively biasing the walls of the chamber 100 relative to the anode electrode 111. A cathode power supply 122 provides voltage to the cathode electrode 120.

During plasma cleaning of the wafer, a gas such as argon, helium, hydrogen, or a combination thereof is supplied to the chamber, from a gas source 155. Once the chamber has an appropriate gas pressure, energy from a DC voltage supplied to the chamber by the cathode power supply 122 ignites and sustains the plasma 110. The active gas atoms bombard the wafer 102 and sputter clean its surface 103. Alternatively, An RF voltage may be used to produce the plasma 110.

A system controller 160 includes hardware that provides the necessary signals to initiate, regulate, and terminate the processes occurring in the preclean chamber 100. The system controller 160 includes a programmable central processing unit (CPU) 162 that is operable with a memory 164 (e.g., RAM, ROM, hard disk and/or removable storage) and well-known support circuits 166 such as power supplies, clocks, cache, and the like. By executing software stored in the memory 164, the system controller 160 produces control outputs 159, 165, 167, 168, and 169 that respectively provide signals for controlling the heater power supply 161, the gas source 155, the cathode power supply 122, the chuck power supply 150, and the heat transfer gas supply 130. The system controller 160 also includes hardware for monitoring the processes through sensors (not shown) in the preclean chamber 100. Such sensors measure system parameters such as temperature, chamber atmosphere pressure, plasma content, voltage and current. Furthermore, the system controller 160 includes at least one display device 170 that displays information in a form that can be readily understood by a human operator. The display device 170 is, for example, a graphical display that portrays system parameters and control icons upon a "touch screen" or light pen based interface.

The steps of the method of the present invention could be implemented by a suitable computer program running on the CPU 162 of the system controller 160. The CPU 162 forms a general purpose computer that becomes a specific purpose computer when executing programs such as the embodiment of the method of the invention depicted in the flow diagram of FIG. 2. Although the invention is described herein as being implemented in software and executed upon a general purpose computer, those skilled in the art will realize that the invention could be implemented using hardware such as an application specific integrated circuit (ASIC) or other hardware circuitry. As such, the invention should be understood as being able to be implemented, in whole or in part, in software, hardware or both.

Those skilled in the art would be readily able to devise a computer program suitable for implementing the present invention from the flow diagram of FIG. 2. The routine 202 begins with step 204, where the wafer 102 is placed on the chuck 104. To retain the wafer, a chucking voltage is applied to the chuck electrodes 106 and 108. Next, in step 206, the wafer 102 may undergo pre-plasma processing such as heating or cooling by flowing backside gas from the heat transfer gas supply 130 through the passage 109 and/or activating a resistive heater 121 to heat the wafer 102. Wafer cooling is generally provided by a water jacket (not shown) within the pedestal base 123.

Once the wafer 102 is ready for plasma processing (cleaning), the chuck power supply 150 is turned off (or the chuck voltage is reduced) in step 208 and the electrodes 106 and 108 are allowed to float. If backside gas is in use, it must be turned off before the chucking voltage is turned off to prevent the wafer 102 from floating off the chuck 104. In step 210, the plasma 110 is ignited by a conventional process. For example, the plasma 110 could be ignited by applying a transient burst of high voltage to the cathode 120 in a manner well known in the art. Other methods of ignition may be used such as applying a transient burst of high gas pressure to the chamber 100 in conjunction with a RF voltage between cathode 120 and anode 111. Those skilled in the art will be able to devise other methods of igniting the plasma 110 in other chambers such as a coil/microwave driven reactors.

It is critical to the practice of the invention that the chuck electrodes 106 and 108 be allowed to float during the plasma ignition step 210. If the electrodes 106 and 108 are grounded, a path exists for charge to flow from the plasma 110 through the wafer 102 to ground via the chuck 104. Such a current to ground could be quite large and cause damage to or field emission from the wafer 102 and/or the chuck 104.

In step 212, after the plasma 110 has been ignited and the transient high voltage is no longer applied, a chucking voltage can be applied to the chuck electrodes 106 and 108.

Backside gas, if required, can then be turned on. If an RF bias is to be applied to the wafer 102 during plasma processing (before or after the plasma 110 is struck) the chuck voltage applied to the chuck electrodes 106 and 108 should be turned off or reduced first. The chuck voltage can be raised after the RF bias has been turned on. The wafer 102 can now be processed by conventional plasma cleaning methods in step 214.

In the present example, the wafer 102 is sputter cleaned by bombardment with ions from the plasma 110;

however, any plasma process may occur in step 214. Such processes include, but are not limited to plasma ashing, plasma etching, reactive ion etching (RIE), glow discharge sputter deposition, RF sputter deposition, magnetron sputtering, plasma enhanced chemical vapor deposition (PECVD) or any other similar process which utilizes a plasma to process a wafer or similar substrate.

A surge of voltage can also occur when the plasma is turned off. Therefore, the steps of the routine 202 should be performed in reverse order once the plasma cleaning is completed. For example, if the RF bias was turned on after striking the plasma, the backside gas would be turned off; then the chuck voltage would be turned off (or reduced); then the RF bias would be turned off; and finally the cathode power supply 122 would be turned off.

Although the invention is described in terms of a high voltage used to retain a wafer on a chuck during plasma ignition, the invention may be used with any other high voltage process that produces a large voltage on a substrate retained on a pedestal having one or more electrodes. For example, the method could be applied to a system having a wafer supported on a pedestal containing a conductive element such as a resistive heater 121 or biasing electrode proximate the wafer 102 that, if grounded or powered during plasma ignition, would produce a substantial electric field between the wafer and ground (i.e., via the grounded or powered element). Consequently, the pedestal is susceptible to arcing and the wafer may experience field emission during plasma ignition. As such, to protect the wafer and chuck from such damage, these elements should be floated during the plasma ignition period.

The present invention has the advantage of preventing charge accumulation on an electrostatic chuck and thereby preventing a loss of chucking force due to such charge accumulation. Consequently, wafer processing is more uniform, leading to higher yields, increased productivity and reduced cost per wafer.

Although various embodiments, which incorporate the teachings of the present invention, have been shown and described in detail herein, those skilled in the art can readily devise many other varied embodiments that still incorporate these teachings.

What is claimed is:

1. A method of protecting a substrate against charging during ignition of a plasma in a process chamber, said method comprising the steps of:
   a) prior to igniting a plasma, electrically floating at least one conductive element that is located within a pedestal that supports the substrate;
   b) igniting the plasma; and
   c) applying a voltage from a power source to said at least one conductive element.

2. The method of claim 1 wherein said voltage applied to said at least one conductive element is a ground potential.

3. The method of claim 1 wherein said conductive element is chosen from the group consisting of a resistive heater, a bias electrode and a chuck electrode.

4. The method of claim 1 wherein said step of igniting a plasma further comprises the step of applying a transient burst of high voltage between an anode electrode and a cathode electrode.

5. A method of retaining a substrate upon an electrostatic chuck having at least one electrode, said method comprising the steps of:
   a) prior to igniting a plasma, electrically floating said at least one electrode;
   b) igniting the plasma; and
   c) once plasma ignition is complete, applying a voltage from a power source to said at least one electrode to retain said substrate.

6. The method of claim 5 further comprising:
   applying said voltage to at least one electrode prior to electrically floating said at least one electrode.

7. The method of claim 5 wherein a first substrate process is performed prior to electrically floating said at least one electrode.

8. The method of claim 5 wherein said step of igniting a plasma further comprises the step of applying a transient burst of high voltage between an anode electrode and a cathode electrode.

9. The method of claim 5 further comprising the step of subjecting said substrate to a plasma process which utilizes said plasma.

10. A method of claim 9 wherein said plasma process comprises precleaning said wafer.

11. A method of retaining a substrate upon an electrostatic chuck having a plurality of electrodes, said method comprising the steps of:
   a) applying a first voltage to two or more of said plurality of electrodes to retain said substrate;
   b) pre-processing said substrate;
   c) deactivating said first voltage and electrically floating said two or more electrodes;
   d) igniting a plasma, proximate said substrate, by applying a transient burst of high voltage between a cathode electrode and an anode electrode;
   e) reapplying said voltage to said two or more of said plurality of electrodes to retain said substrate; and
   f) subjecting said substrate to a plasma process which utilizes said plasma.

12. The method of claim 11 wherein step b) includes temperature stabilizing said wafer by applying a heat transfer medium between the substrate and the electrostatic chuck and, prior to step c), ceasing the supply of the heat transfer medium.

13. The method of claim 12 wherein step e) includes reinitiating the supply of the heat transfer medium after said voltage is reapplied to said two or more electrodes.

* * * * *